(12) United States Patent
Wu et al.

(10) Patent No.: US 12,274,028 B2
(45) Date of Patent: Apr. 8, 2025

(54) LIQUID COOLING SYSTEM WITH LIQUID LEAKAGE DETECTING MODULE

(71) Applicants: INVENTEC (PUDONG) TECHNOLOGY CORPORATION, Shanghai (CN); INVENTEC CORPORATION, Taipei (TW)

(72) Inventors: Jiang-Jun Wu, Shanghai (CN); Yi-Dong Ji, Shanghai (CN); Pin-Yi Xiang, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 206 days.

(21) Appl. No.: 18/123,376

(22) Filed: Mar. 20, 2023

(65) Prior Publication Data

US 2024/0090167 A1  Mar. 14, 2024

(30) Foreign Application Priority Data

Sep. 13, 2022 (CN) .......................... 202211111715.5

(51) Int. Cl.
*H05K 7/20* (2006.01)
*G01M 3/16* (2006.01)

(52) U.S. Cl.
CPC ........ *H05K 7/20272* (2013.01); *G01M 3/165* (2013.01); *H05K 7/20254* (2013.01); *H05K 7/20981* (2013.01); *H05K 7/20772* (2013.01)

(58) Field of Classification Search
CPC .......... H05K 7/20272; H05K 7/20254; H05K 7/20981; H05K 7/20772; G01M 3/165
See application file for complete search history.

(56) References Cited

U.S. PATENT DOCUMENTS

| | | | |
|---|---|---|---|
| 11,815,428 B1 * | 11/2023 | Varrey | G01M 3/18 |
| 11,960,335 B2 * | 4/2024 | Gao | H05K 7/20781 |
| 2010/0128431 A1 * | 5/2010 | Eriksen | G06F 1/20 |
| | | | 29/890.035 |

(Continued)

FOREIGN PATENT DOCUMENTS

| | | | | |
|---|---|---|---|---|
| CN | 211604051 U | * | 9/2020 | |
| CN | 113154271 A | * | 7/2021 | ............... F17D 5/06 |

(Continued)

*Primary Examiner* — Zachary Pape

(57) ABSTRACT

The present disclosure provides a liquid cooling system for dissipating heat from a heat source, including a liquid cooling module and a liquid leakage detecting module. The liquid cooling module includes a liquid cooling component. The liquid cooling component includes a liquid cooling plate, a liquid supply pipeline and a liquid return pipeline. The liquid supply pipeline and the liquid return pipeline are in communication with the liquid cooling plate receptively. The liquid leakage detecting module includes a liquid leakage detecting device, a monitoring device and a main wire. The liquid leakage detecting device includes a hub and a plurality of liquid leakage detection branches. The liquid leakage detection branches are electrically connected to the hub in parallel, and are provided in the liquid supply pipeline and the liquid return pipeline respectively. The main wire electrically connects the hub to the monitoring device.

9 Claims, 7 Drawing Sheets

(56) References Cited

U.S. PATENT DOCUMENTS

| | | | |
|---|---|---|---|
| 2015/0237767 A1* | 8/2015 | Shedd | F28F 3/12 165/104.31 |
| 2019/0307019 A1* | 10/2019 | Nakae | H05K 7/20254 |
| 2024/0085262 A1* | 3/2024 | Wu | G01M 3/165 |

FOREIGN PATENT DOCUMENTS

| | | | | |
|---|---|---|---|---|
| CN | 213714649 U | * | 7/2021 | G01M 3/16 |
| CN | 114967886 A | * | 8/2022 | |

* cited by examiner

LIQUID COOLING SYSTEM WITH LIQUID LEAKAGE DETECTING MODULE

CROSS-REFERENCE TO RELATED APPLICATIONS

This application claims priority of Chinese Patent Application No. 202211111715.5, filed on Sep. 13, 2022, the content of which is hereby incorporated by reference in its entirety.

TECHNICAL FIELD

The present disclosure relates to liquid cooling systems, in particular to a liquid cooling system having a liquid leakage detecting module.

BACKGROUND

In order to effectively dissipate heat generated by a central processing unit and a display adapter in a server, a plurality of liquid cooling plates are provided on the central processing unit and the display adapter in series or parallel with pipes, and the liquid cooling plates are connected to a liquid cooling system to take away the heat generated by the central processing unit and the display adapter.

However, coolant is tended to leak from a junction of two pipes or a junction between the pipe and the liquid cooling plate, which may damage the server. In order to detect whether the coolant leaks, a liquid leakage detection rope is used. However, due to a complexity and long length of a liquid cooling loop formed by the pipes and the liquid cooling plate, the length of the liquid leakage detection rope is also very long, and a laying operation of liquid cooling loop is very difficult, which is tended to damage the liquid leakage detection rope and results in the increase of undesirable situations such as an insensitive alarm or a false alarm of the liquid leakage detection rope.

SUMMARY

According to some exemplary embodiments of the present disclosure, a liquid cooling system is provided.

A liquid cooling system configured to dissipate heat from a heat source, including a liquid cooling module and a liquid leakage detecting module. The liquid cooling module includes a liquid cooling component. The liquid cooling component includes a liquid cooling plate, a liquid supply pipeline and a liquid return pipeline. The liquid supply pipeline is in communication with the liquid cooling plate. The liquid return pipeline is in communication with the liquid cooling plate. The liquid leakage detecting module includes a liquid leakage detecting device, a monitoring device and a main wire. The liquid leakage detecting device includes a hub and a plurality of liquid leakage detection branches. The liquid leakage detection branches are electrically connected to the hub in parallel, and the plurality of liquid leakage detection branches are provided in the liquid supply pipeline and the liquid return pipeline, respectively. The main wire electrically connects the hub to the monitoring device.

These and other objects, advantages, purposes and features will become apparent upon review of the following specification in conjunction with the drawings.

DETAILED DESCRIPTION OF THE EMBODIMENTS

Figure 1:
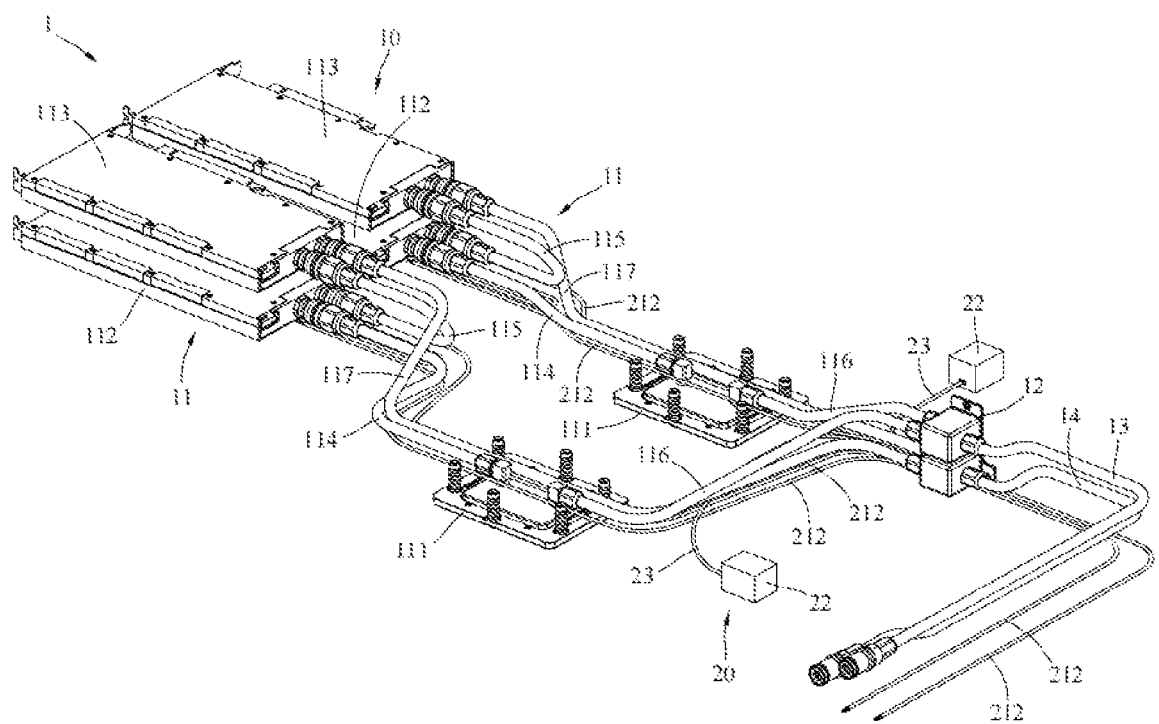
FIG. 1 is a perspective view of a liquid cooling system according to an embodiment of the present disclosure.

Referring to FIG. 1, which is a perspective view of a liquid cooling system 1 according to an embodiment of the present disclosure.

In this embodiment, the liquid cooling system 1 is configured to dissipate heat from a plurality of heat sources (not shown) in a server. The heat sources include a plurality of central processing units and a plurality of display adapters. The liquid cooling system 1 includes a liquid cooling module 10 and a liquid leakage detecting module 20.

Figure 2:
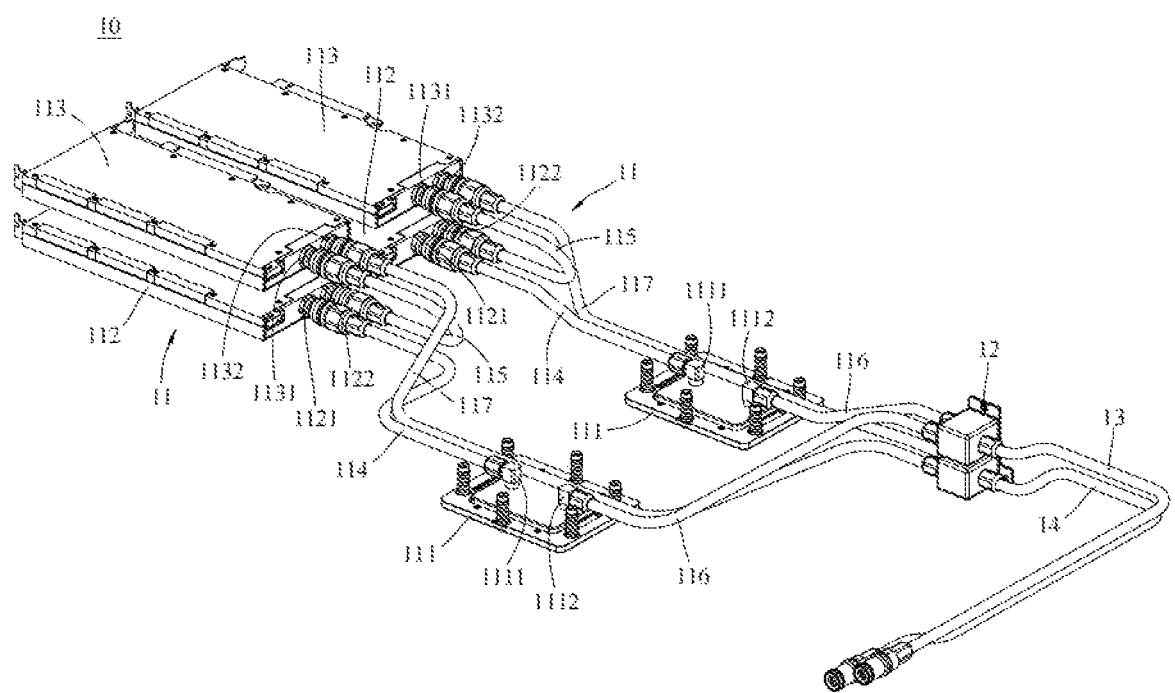
FIG. 2 is a perspective view of a liquid cooling module of FIG. 1.
Figure 3:
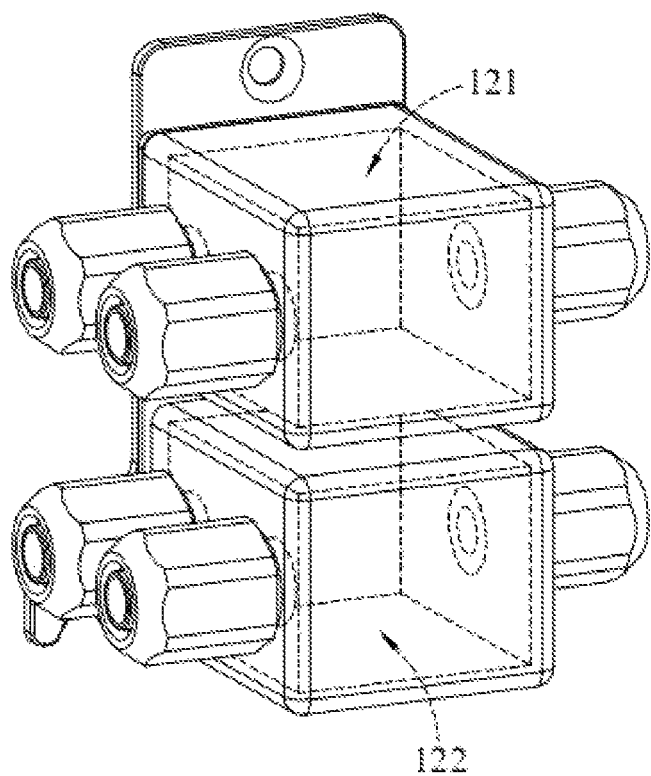
FIG. 3 is a perspective view of a flow divider of FIG. 2.
Figure 4:
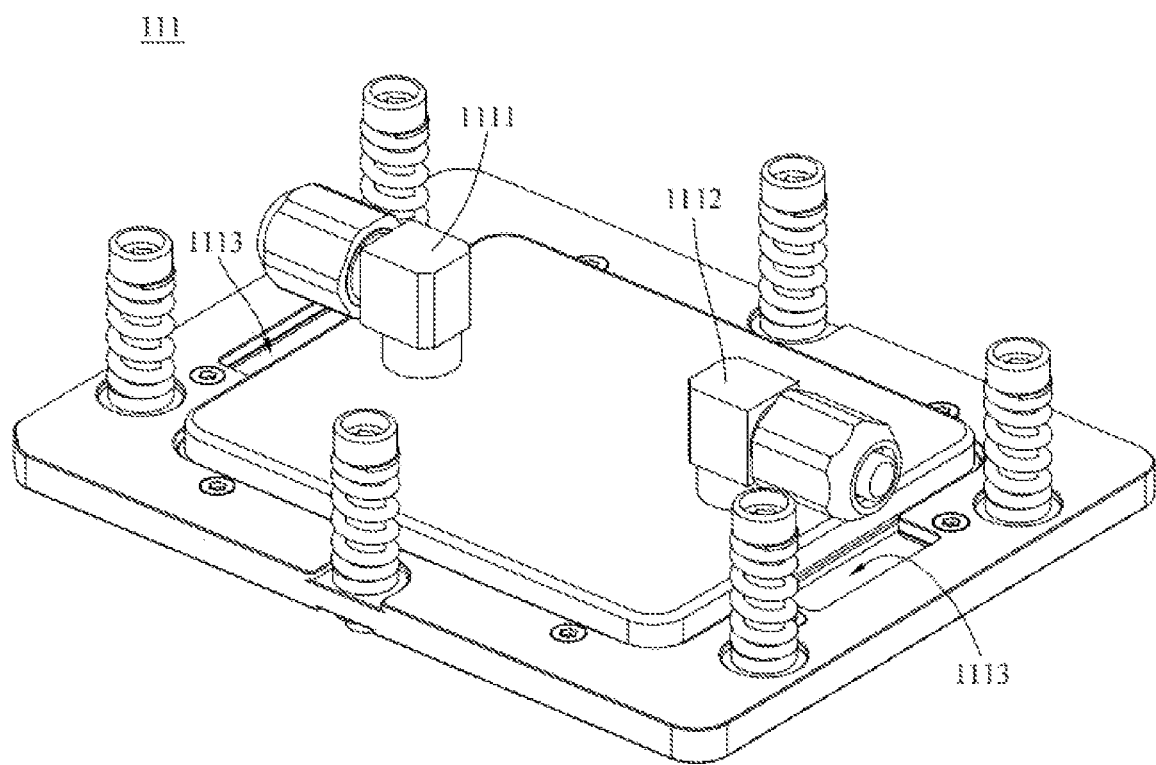
FIG. 4 is a perspective view of a first liquid cooling plate of FIG. 2.

Referring to FIG. 2 to FIG. 4, FIG. 2 is a perspective view of the liquid cooling module of FIG. 1, FIG. 3 is a perspective view of a flow divider of FIG. 2, and FIG. 4 is a perspective view of a first liquid cooling plate of FIG. 2.

The liquid cooling module 10 includes two liquid cooling components 11. In addition, the liquid cooling module 10 may further include a flow divider 12, a main liquid supply pipeline 13, and a main liquid return pipeline 14.

The two liquid cooling components 11 have the same structure, so only one of the liquid cooling components 11 will be described in detail below. The liquid cooling component 11 includes a first liquid cooling plate 111, a second liquid cooling plate 112, a third liquid cooling plate 113, two connecting pipelines 114 and 115, a liquid supply pipeline 116, and a liquid return pipeline 117. The first liquid cooling plate 111 is a liquid cooling plate of the central processing unit, the second liquid cooling plate 112 and the third liquid cooling plate 113 are the liquid cooling plates of the display adapters. The first liquid cooling plate 111, the second liquid cooling plate 112, and the third liquid cooling plate 113 are sequentially connected in series through the two connecting pipes 114 and 115. Specifically, the first liquid cooling plate 111 has two joints 1111 and 1112, the second liquid cooling plate 112 has two joints 1121 and 1122, and the third liquid cooling plate 113 has two joints 1131 and 1132. The joint 1111 of the first liquid cooling plate 111 is connected to the joint 1121 of the second liquid cooling plate 112 through the connecting pipeline 114, while the joint 1122 of the second liquid cooling plate 112 is connected to the joint 1131 of the third liquid cooling plate 113 through the connecting pipeline 115. One end of the liquid supply pipeline 116 and one end of the liquid return pipeline 117 are connected to the joint 1112 of the first liquid cooling plate 111 and the joint 1132 of the third liquid cooling plate 113, respectively.

In this embodiment, the first liquid cooling plate 111 may further have two liquid storage tanks 1113 corresponding to the two joints 1111 and 1112, respectively. The two liquid storage tanks 1113 are configured to receive the coolant leaking from the joints 1111 and 1112, so as to delay the time when the coolant drips onto a motherboard (not shown) or other electronic components. It should be noted that the fluid storage tank 1113 is an optional structure that can be omitted.

The flow divider 12 has a flow separation chamber 121 and a confluence chamber 122 which are separated from each other. The two liquid supply pipelines 116 of the two liquid cooling components 11 and the main liquid supply pipeline 13 are in communication with the flow separation chamber 121 of the flow divider 12, while the two liquid return pipelines 117 of the two liquid cooling components 11 and the main liquid return pipeline 14 are in communication with the confluence chamber 122 of the flow divider 12. The main liquid supply pipeline 13 is in communication with a pump (not shown), while the main liquid return pipeline 14 is in communication with, for example, a heat exchanger (not shown), while the pump is in communication with the heat exchanger, so that the two liquid cooling components 11, the flow divider 12, the main liquid supply pipeline 13, the main liquid return pipeline 14, the pump and the heat exchanger cooperatively form a liquid cooling cycle. The pump provides a power for the coolant to flow in the liquid cooling cycle.

A circulation process of the coolant in the liquid cooling system 1 will be described below. The coolant flows into the flow separation chamber 121 of the flow divider 12 through the main liquid supply pipeline 13 for distribution. Then, the coolant flows to the two first liquid cooling plates 111 through the two liquid supply pipelines 116 in a two-way manner to absorb the heat generated by the central processing unit. Next, the coolant flows to the second liquid cooling plate 112 and the third liquid cooling plate 113 through the connecting pipes 114 and 115 in sequence, so as to absorb the heat generated by the display adapters. Then, the coolant flows to the confluence chamber 122 of the flow divider 12 through the two liquid return pipelines 117 for confluence, and then flows to a heat sink through the main liquid return pipeline 14 for cooling. In this way, the coolant completes one liquid cooling cycle, and then a next liquid cooling cycle will be repeated.

Figure 5:
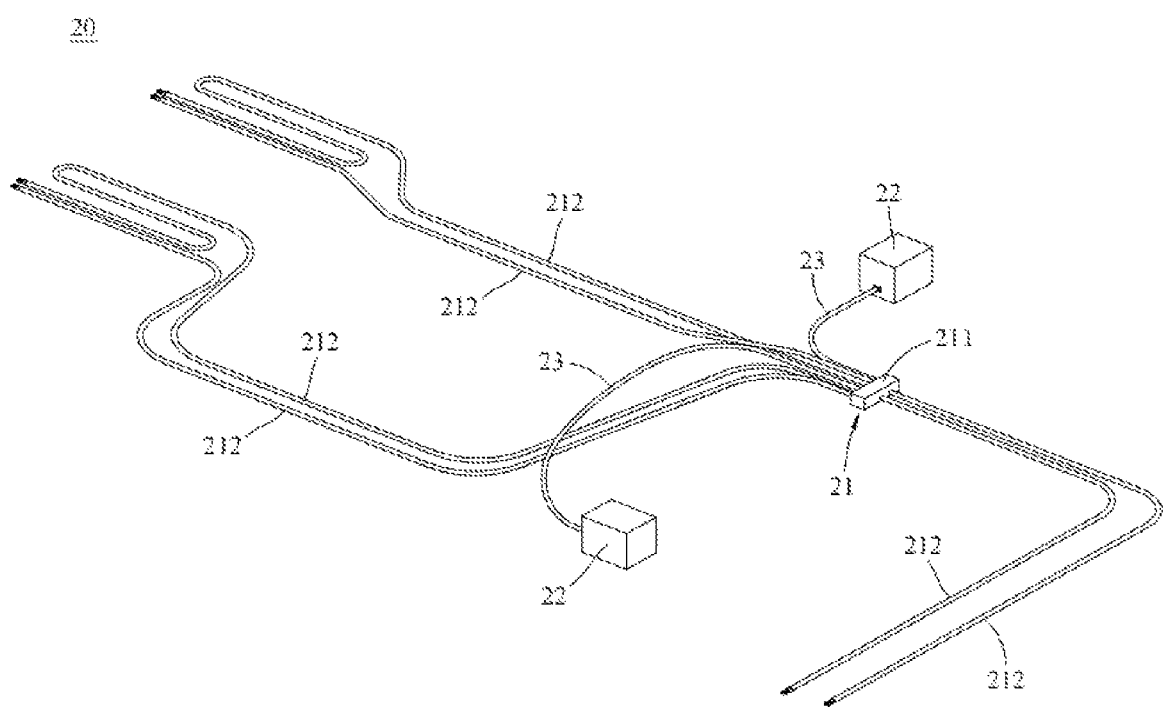
FIG. 5 is a perspective view of a liquid leakage detecting module of FIG. 1.
Figure 6:
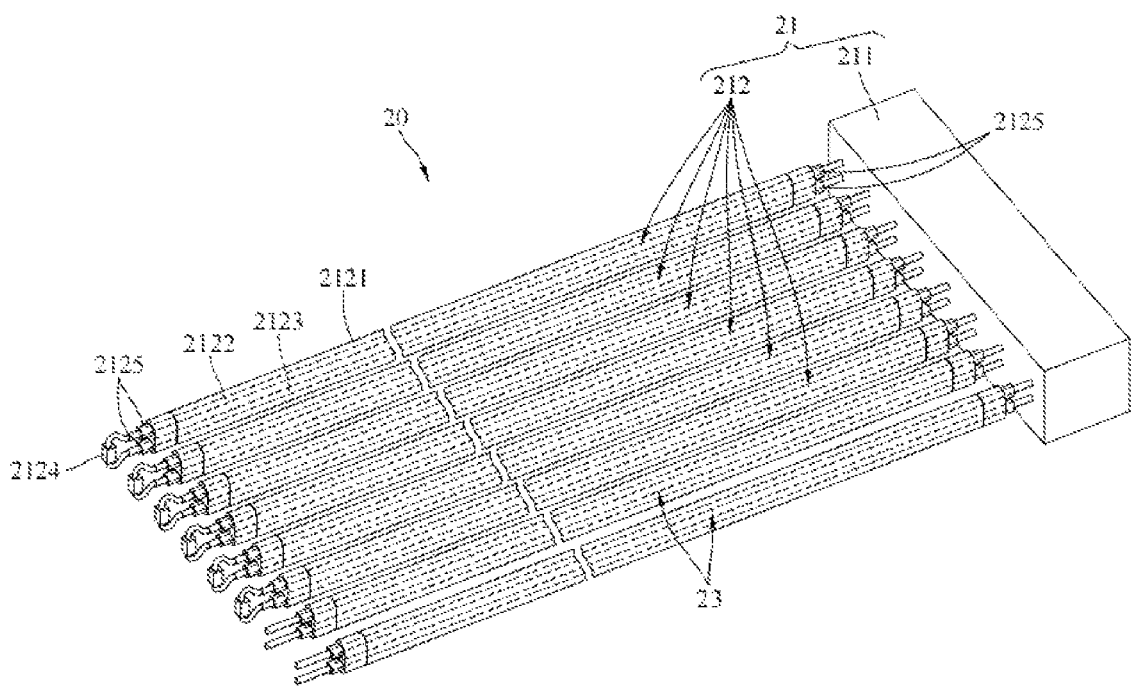
FIG. 6 is a perspective view of the liquid leakage detecting module of FIG. 5.

Referring to FIG. 5 and FIG. 6, FIG. 5 is a perspective view of the liquid leakage detecting module of FIG. 1, FIG. 6 is a perspective view of the liquid leakage detecting module of FIG. 5.

The liquid leakage detecting module 20 includes a liquid leakage detecting device 21, two monitoring devices 22, and two main wires 23.

The liquid leakage detecting device 21 includes a hub 211 and a plurality of liquid leakage detection branches 212. The liquid leakage detection branches 212 are electrically connected to the hub 211 in parallel. A length of two liquid leakage detection branches 212 is about 800 mm, and the two liquid leakage detection branches 212 are located in the main liquid supply pipeline 13 and the main liquid return pipeline 14, respectively. The other two liquid leakage detection branches 212 are about 800 mm, and are respectively arranged along the liquid supply pipeline 116, the first liquid cooling plate 111 and the connecting pipeline 114. The other two liquid leakage detection branches 212 are about 1000 mm, and are respectively arranged along the connecting pipeline 115 and the liquid return pipeline 117.

Since the structures of the liquid leakage detection branches 212 are similar, only one liquid leakage detection branch 212 will be described in detail below. The liquid leakage detection branch 212 is a liquid leakage detection rope. Each of the liquid leakage detection branches 212 includes a water absorption rope 2121, a first wire 2122, a second wire 2123, and a resistor 2124. The first wire 2122 and the second wire 2123 are located in the water absorption rope 2121. One end of the first wire 2122 and one end of the second wire 2123 are respectively connected to a positive electrode and a negative electrode of the hub 211 by, for example, welding, the other end of the first wire 2122 is connected to the other end of the second wire 2123 through the resistor 2124. The first wire 2122, the second wire 2123, the resistor 2124, and the hub 211 cooperatively form a closed loop.

In addition, the liquid leakage detection branch 212 includes a plurality of insulating elements 2125. The insulating elements 2125 are located on opposite ends of the first wire 2122 and opposite ends of the second wire 2123, so as to avoid short circuit when the first wire 2122 and the second wire 2123 are in contact with each other. It should be noted that the insulating element 2125 is an optional component that may be omitted.

In this embodiment, the two main wires 23 are connected to the hub 211 through the two monitoring devices 22, respectively. When the water absorption rope 2121 of one of the liquid leakage detection branches 212 absorbs the leaked coolant, the first wire 2122 and the second wire 2123 are electrically connected. At this time, the monitoring device 22 determines that there is liquid leakage in the current pipeline through a change of a resistance value of the overall circuit, and sends a liquid leakage alarm to remind a maintenance staff to carry out maintenance. For example, if the resistance value of each liquid leakage detection branch 212 is R, the resistance value of the overall circuit is R/6 when no liquid leakage occurs. When the water absorption rope 2121 of one of the liquid leakage detection branches 212 absorbs the leaked coolant, the resistance value R of the liquid leakage detection branch 212 becomes close to zero, and the resistance value of the whole circuit plummets to close to zero, so that the monitoring device 22 determines that the liquid leakage occurs.

In this embodiment, the liquid leakage detection branches 212 are electrically connected to the hub 211 in parallel, and are respectively located in the liquid supply pipeline 116 and the liquid return pipeline 117, so that a total length of the leakage detection can be shared by the liquid leakage detection branches 212, thus the length of a single liquid leakage detection branch 212 can be reduced, and the total length of the overall liquid leakage detection branch 212 can be reduced. Therefore, a cost and difficulty of laying the liquid leakage detection branches 212 can be reduced, a damage to the liquid leakage detection branches 212 during a laying process can be avoided, and an accuracy of liquid leakage detection can be maintained.

In addition, the liquid leakage detection branches 212 are located in the liquid cooling plate and/or pipeline, which do not occupy additional space and will not affect a spatial layout of other components of the server.

In this embodiment, the liquid leakage detecting module 20 includes two monitoring devices 22, which can cooperatively determine whether the liquid leakage occurs. It should be noted that a number of monitoring devices 22 is not limited to two, the liquid leakage detecting module 20 may only have one monitoring device 22.

In this embodiment, the coolant is recycled in the two first liquid cooling plates, the two second liquid cooling plates and the two third liquid cooling plates through the pipelines connected in series and in parallel. In the case of the same power consumption, the required liquid supply and energy supply are compacted to the smallest, which reduces the operating energy consumption of the system and the cost.

It should be noted that a number of the liquid cooling component 11 is not limited to two. In other embodiments, only one liquid cooling component may be provided. In that case, the flow divider 12, the main liquid supply pipeline 13 and the main liquid return pipeline 14 of the liquid cooling module 10 can be omitted, while the liquid supply pipeline 116 and the liquid return pipeline 117 of the liquid cooling component 11 can be directly connected to the pump and the heat exchanger, respectively.

In addition, a number of liquid cooling plates of each liquid cooling component 11 is not limited to three, and may be increased or decreased according to actual needs.

In this embodiment, by connecting the other end of the first wire 2122 to the other end of the second wire 2123 through the resistor 2124, the first wire 2122, the second wire 2123, the resistor 2124 and the hub 211 cooperatively form the closed loop, whether the liquid leakage detection branch 212 is damaged can be detected. For example, according to Ohm's law, if the resistance value of each liquid leakage detection branch 212 is R, and the total resistance value of the overall circuit is about R/6 (the resistance values of the first wire 2122 and the second wire 2123 are very small and ignored). If it is detected that the resistance value of the overall circuit is R/5, it means that there is one liquid leakage detection branch 212 being damaged or broken. Similarly, it is easy to detect whether the liquid leakage detection branch 212 is normal.

Figure 7:
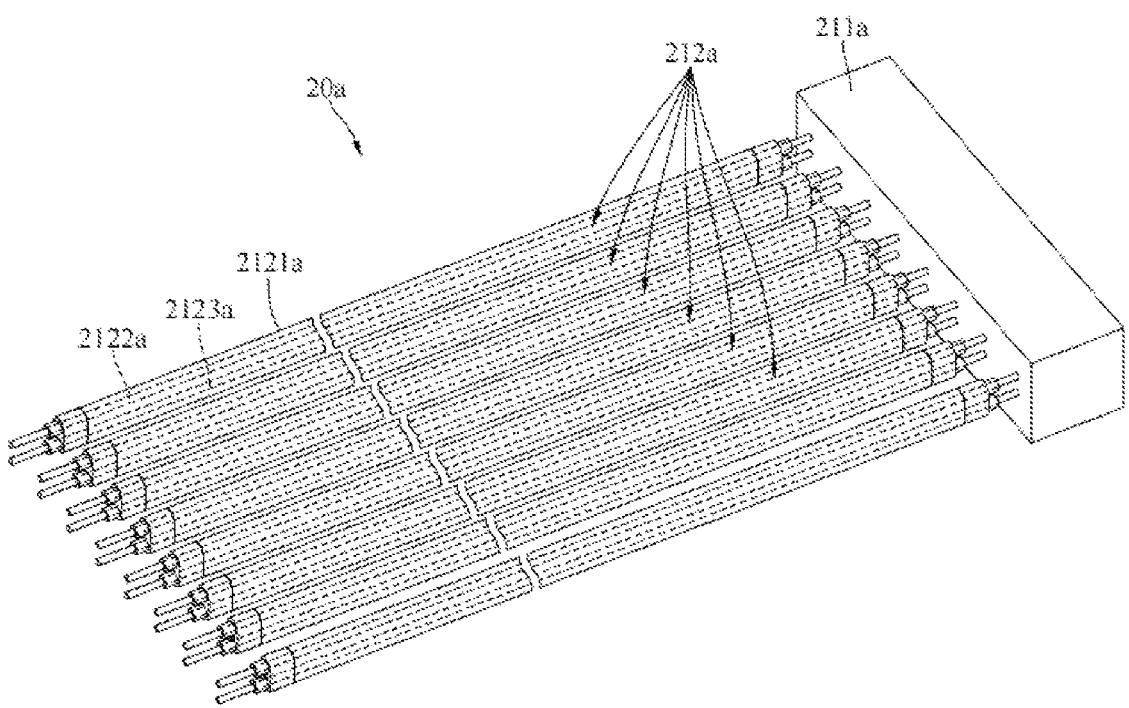
FIG. 7 is a perspective view of the liquid leakage detecting module according to another embodiment of the present disclosure.

It should be noted that the liquid leakage detection branch 212 is not limited to include the resistor 2124. Referring to FIG. 7, which is a perspective view of the liquid leakage detecting module according to another embodiment of the present disclosure.

In this embodiment, the liquid leakage detecting module 20a is similar to the aforementioned liquid leakage detecting module 20, and the difference lies mainly in that the liquid leakage detection branch 212a of the liquid leakage detecting module 20a have no resistor, and the first wire 2122a, the second wire 2123a and the hub 211a of the liquid leakage detection branch 212a cooperatively form an opened loop.

In such a configuration, when the water absorption rope 2121a of one of the liquid leakage detection branches 212a absorbs the leaked coolant, the first wire 2122a and the second wire 2123a are electrically connected. At this time, the monitoring device (as shown in FIG. 5) can determine that there is liquid leakage in the current pipeline through the change of the resistance value of the overall circuit, and sends the liquid leakage alarm to remind the maintenance staff to carry out maintenance. Specifically, before the first wire 2122a and the second wire 2123a are electrically connected, the resistance value of each liquid leakage detection branch 212a is infinite, and the resistance value of the overall circuit is infinite. When the first wire 2122a and the second wire 2123a are electrically connected, the resistance values of the coolant, the first wire 2122a and the second wire 2123a becomes very small, so that the resistance value of the liquid leakage detection branch 212a changes from infinite to close to zero, and the resistance value of the overall circuit plummets to close to zero. At this time, the monitoring device determines that the liquid leakage occurs.

According to the aforementioned liquid cooling system 1, the liquid leakage detection branches 121(212a) are electrically connected to the hub 211(211a) in parallel, and located in the liquid supply pipeline 116 and the liquid return pipeline 117, respectively, so that a total length of the liquid leakage detection can be shared by the liquid leakage detection branches 121(212a), so as to reduce the length of a single liquid leakage detection branch 121(212a), and thus reduce the total length of the overall liquid leakage detection branch 121(212a). Therefore, a cost and difficulty of laying the liquid leakage detection branches 121(212a) can be reduced, and a damage to the liquid leakage detection branches 121(212a) during a laying process can be avoided, and an accuracy of liquid leakage detection can be maintained.

The above-mentioned embodiments do not constitute a limitation on the protection scope of the technical solution. Any modifications, equivalent replacements and improvements made within the spirit and principles of the above-mentioned embodiments shall be included within the protection scope of this technical solution.

The foregoing descriptions are merely specific embodiments of the present invention, but are not intended to limit the protection scope of the present invention. Any variation or replacement readily figured out by a person skilled in the art within the technical scope disclosed in the present invention shall all fall within the protection scope of the present invention.

What is claimed is:

1. A liquid cooling system configured to dissipate heat from a heat source, the system comprising:
   a liquid cooling module comprising:
      a liquid cooling component comprising:
         a liquid cooling plate;
         a liquid supply pipeline in communication with the liquid cooling plate; and
         a liquid return pipeline in communication with the liquid cooling plate; and
   a liquid leakage detecting module comprising:
      a liquid leakage detecting device comprising:
         a hub; and
         a plurality of liquid leakage detection branches electrically connected to the hub in parallel, and the plurality of liquid leakage detection branches being provided in the liquid supply pipeline and the liquid return pipeline, respectively;
      a monitoring device; and
      a main wire electrically connecting the hub to the monitoring device;
   wherein the liquid cooling module further comprises a flow divider, a main liquid supply pipeline, and a main liquid return pipeline, the flow divider has a flow separation chamber and a confluence chamber, two liquid cooling components are provided, the two liquid supply pipelines of the two liquid cooling components and the main liquid supply pipeline are in communication with the flow separation chamber, the two liquid return pipelines of the two liquid cooling components and the main liquid return pipeline are in communication with the confluence chamber, and the plurality of liquid leakage detection branches are provided in the two liquid supply pipelines and the two liquid return pipelines of the two liquid cooling components, the main liquid supply pipeline, and the main liquid return pipeline, respectively.

2. The liquid cooling system according to claim 1, wherein the liquid leakage detection branch is a liquid leakage detection rope.

3. The liquid cooling system according to claim 1, wherein each of the liquid leakage detection branches comprises a water absorption rope, a first wire, a second wire, and a resistor, the first wire and the second wire are located in the water absorption rope, one end of the first wire and one end of the second wire are connected to a positive electrode and a negative electrode of the hub, respectively, the other end of the first wire is connected to the other end of the second wire through the resistor, and the first wire, the second wire, the resistor, and the hub cooperatively form a closed loop.

4. The liquid cooling system according to claim 1, wherein each of the liquid leakage detection branches comprises a water absorption rope, a first wire, and a second wire, the first wire and the second wire are located in the water absorption rope, one end of the first wire and one end of the second wire are connected to a positive electrode and a negative electrode of the hub, respectively, and the first wire, the second wire, and the hub cooperatively form an opened loop.

5. The liquid cooling system according to claim 1, wherein two monitoring devices and two main wires are provided, and the two main wires connect the two monitoring devices to the hub respectively.

6. The liquid cooling system according to claim 1, wherein a plurality of liquid cooling plates are provided, the plurality of liquid cooling plates comprise a first liquid cooling plate, a second liquid cooling plate, and a third liquid cooling plate, the liquid cooling component further comprises two connecting pipelines, the first liquid cooling plate, the second liquid cooling plate, and the third liquid cooling plate are sequentially connected in series through the two connecting pipes, and the liquid supply pipeline and the liquid return pipeline are in communication with the first liquid cooling plate and the third liquid cooling plate, respectively.

7. The liquid cooling system according to claim 6, wherein one of the plurality of liquid leakage detection branches is provided along the liquid supply pipeline, the first liquid cooling plate, and one of the connecting pipelines, and another one of the plurality of liquid leakage detection branches is provided along the liquid return pipeline and the other connecting pipeline.

8. The liquid cooling system according to claim 6, wherein the first liquid cooling plate is a liquid cooling plate of a central processing unit, and the second liquid cooling plate and the third liquid cooling plate are liquid cooling plates of a display adapter.

9. The liquid cooling system according to claim 8, wherein the first liquid cooling plate comprises two liquid storage tanks and two joints corresponding to the two liquid storage tanks.

* * * * *